(12) United States Patent
Hsu et al.

(10) Patent No.: US 9,905,503 B2
(45) Date of Patent: Feb. 27, 2018

(54) PACKAGE STUCTURE AND METHOD OF FABRICATING THE SAME

(71) Applicant: PHOENIX PIONEER TECHNOLOGY CO., LTD., Hsinchu County (TW)

(72) Inventors: Shih-Ping Hsu, Hsinchu County (TW); Chao-Chung Tseng, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 14/963,333

(22) Filed: Dec. 9, 2015

(65) Prior Publication Data
US 2016/0181193 A1    Jun. 23, 2016

(30) Foreign Application Priority Data
Dec. 22, 2014 (CN) .......................... 2014 1 0802435

(51) Int. Cl.
| | |
|---|---|
| H01L 21/00 | (2006.01) |
| H01L 23/48 | (2006.01) |
| H01L 23/52 | (2006.01) |
| H01L 29/40 | (2006.01) |
| H01L 23/498 | (2006.01) |
| H01L 23/538 | (2006.01) |

(52) U.S. Cl.
CPC .... *H01L 23/49816* (2013.01); *H01L 23/5389* (2013.01); *H01L 23/49822* (2013.01); *H01L 2924/0002* (2013.01); *Y02P 80/30* (2015.11)

(58) Field of Classification Search
None
See application file for complete search history.

(56) References Cited

U.S. PATENT DOCUMENTS

| | | | |
|---|---|---|---|
| 2004/0178510 A1* | 9/2004 | Sunohara | ............ H01L 23/5383 257/781 |
| 2005/0173786 A1* | 8/2005 | Huang | .............. H01L 23/49833 257/678 |

(Continued)

*Primary Examiner* — Calvin Choi
(74) *Attorney, Agent, or Firm* — Amin, Turocy & Watson LLP (57) ABSTRACT

A package structure and a method of fabricating the same are provided. The method includes forming a first wiring layer on a carrier board, forming a plurality of first conductors on the first wiring layer, encapsulating the first wiring layer and the first conductors with a first insulating layer, forming a second wiring layer on the first insulating layer, forming a plurality of second conductors on the second wiring layer, encapsulating the second wiring layer and the second conductors with a second insulating layer, and forming at least one opening in the second insulating layer. The at least one opening extends to a second surface of the first insulating layer, such that at least one electronic component can be disposed in the at least one opening. With forming two insulating layers first followed by forming the at least one opening, there is no need to stack or laminate the substrate that already has an opening, and the electronic component is free of displacement due to any compression. Therefore, a package structure thus fabricated has an increased yield rate.

18 Claims, 6 Drawing Sheets

(56) References Cited

U.S. PATENT DOCUMENTS

2009/0294156 A1* 12/2009 Ueno ................ H01L 23/13
                                                                               174/255
2014/0185257 A1* 7/2014 Hsu ................ H05K 3/4697
                                                                               361/761

\* cited by examiner

PACKAGE STUCTURE AND METHOD OF FABRICATING THE SAME

BACKGROUND OF THE INVENTION

1. Field of the Invention

The present invention relates to package structures, and, more particularly, to a package structure with embedded electronic components and a method of fabricating the same.

2. Description of Related Art

As the packaging technology advances, semiconductor devices with different types of chip packaging technologies have been developed to be incorporated in various different electronic devices such as smart phones, tablets, networks, or laptops. Such semiconductor device mainly involves disposing a chip on a package substrate, where the chip is electrically connected with the package substrate, followed by an encapsulating process with the use of an encapsulating material. In order to reduce the package height, a type of package with the chip embedded in a package substrate is preferred, as the overall package size is reduced while the electrical performance is improved.

FIGS. 1A-1D are cross-sectional views showing a method of fabricating a package structure according to the conventional art.

Figure 1A:
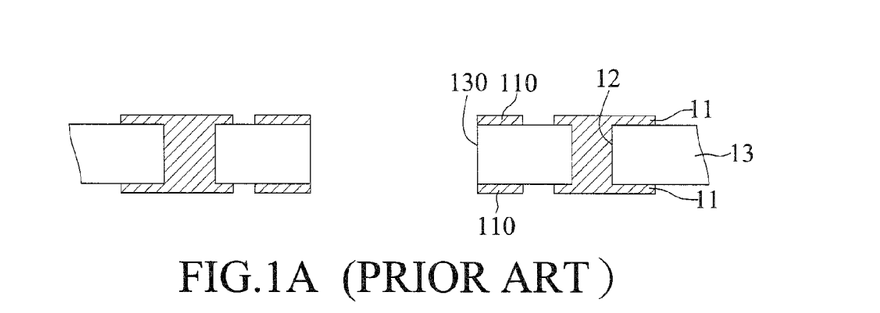
FIGS. 1A-1D are cross-sectional schematic views showing a method of fabricating a package structure according to the conventional art.

As shown in FIG. 1A, a core board 13 having a through opening 130 is provided, and a plurality of inner wirings 11 and a copper window 110 are formed on top and bottom sides of the core board 13. A plurality of conductive pillars 12 are formed in the core board 13 for electrically connecting the inner wirings 11 on the top and bottom sides of the core board 13.

Figure 1B:
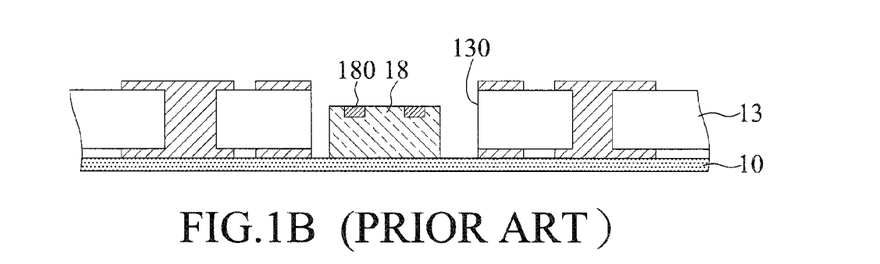

As shown in FIG. 1B, a carrier board 10 such as a polyimide (PI) tape is disposed on the bottom side of the core board 13, so as to receive a semiconductor chip 18 having a plurality of electrode pads 180 in the opening 130, as well as disposing the semiconductor chip 18 on the carrier board 10. With the design of the copper window 110, the semiconductor chip 18 is prevented from contacting the inner wirings 11.

Figure 1C:
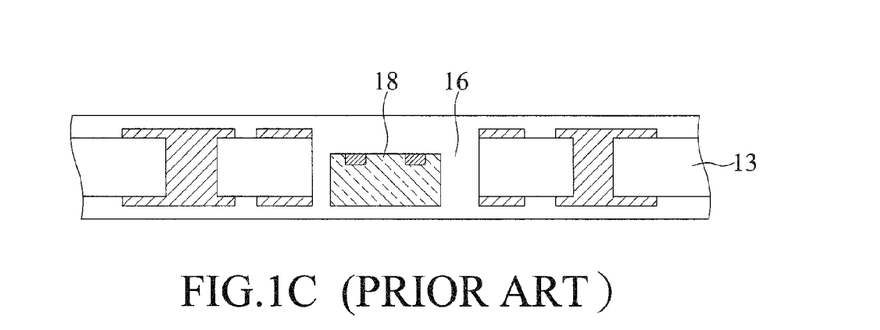

As shown in FIG. 1C, a dielectric material is laminated on the top side of the core board 13 and on the semiconductor chip 18, so as to fill in gaps between walls of the opening 130 and semiconductor chip 18. Then, the carrier board 10 is removed, and another dielectric material is laminated on the bottom side of the core board 13, such that the two dielectric materials form a dielectric layer 16.

Figure 1D:
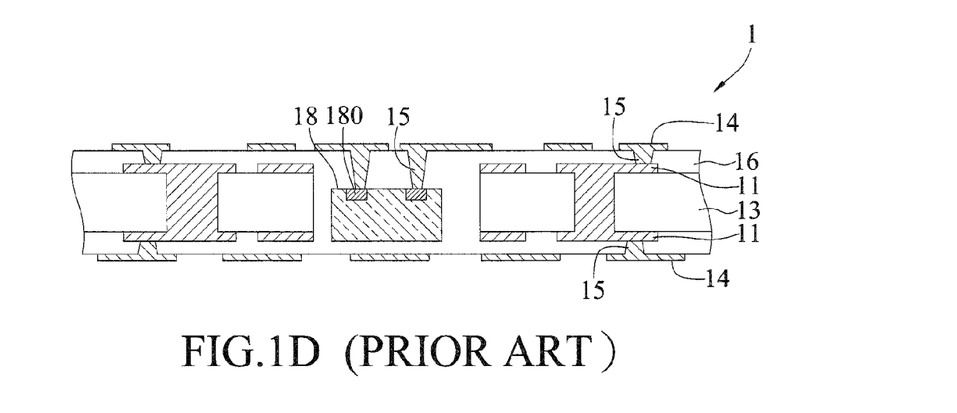

As shown in FIG. 1D, wiring layers 14 are formed on the top and bottom sides of the dielectric layer 16, respectively, and the wiring layer 14 has conductors 15 formed in the dielectric layer 16 and electrically connected with the electrode pads 180 and the inner wirings 11.

However, in the method of fabricating a package structure 1 according to the conventional art, the copper window 110 is used to serve as a spacing layer, which undesirably diminishes the routable regions for the inner wirings 11. Moreover, an additional laser process with the use of $CO_2$ laser to form the opening 130 increases the cost, and the organic glass fibers of core board 13 are exposed, which would result in poor yield and poor quality of the placement of the semiconductor chip 18.

Further, a laser process is required to form blind holes (i.e. at the corresponding positions of the conductors 15) or vias (i.e. at the corresponding positions of the conductive pillars 12), such that the shapes of the holes or vias can only be circular and not as desired.

In addition, with the use of PI tape as the carrier board 10 to fix the semiconductor chip 18 is also undesirable, which not only requires additional processes for attaching and detaching the tapes, additional cost involved for the tapes and other equipment is also undesirable.

Moreover, it is required to fabricate the dielectric material twice, followed by a laminating process, to form the dielectric layer 16. As such, a pre-pressing and a curing pressing process are required, which not only is time consuming and expensive, it may also lead to dislocation (or even spinning) of the semiconductor chip 18, such that an accurate alignment for positioning the semiconductor chip 18 in the opening 130 is not easy, resulting in a poor alignment between the electrode pads 180 of the semiconductor chip 18 and the conductors 15. Accordingly, poor electrical connection or electrical connection failure may occur and lead to a poor yield.

FIGS. 1A'-1D' show another method of fabricating package structure according to the conventional art.

As shown in FIG. 1A', a first wiring layer 11' is formed on a carrier board 10 such as a copper foil substrate, and a passive component 18' such as a multi-layered ceramic capacitor (MLCC) is securely fixed on the first wiring layer 11' by an insulating adhesive 180'.

As shown in FIG. 1B', a first dielectric material layer 13' having an opening 130 for fixing the passive component 18' therein is formed on the carrier board 10.

As shown in FIG. 1C', a second dielectric material layer is formed and laminated on the top side of the first dielectric material layer 13' and on the passive component 18', and the second dielectric material layer is filled in gaps between walls of the opening 130 and the passive component 18', allowing the first dielectric material layer 13' and the second dielectric material layer to be heat-pressed to form a dielectric encapsulating layer 16', so as to securely fix the passive component 18' and the first wiring layer 11' in the dielectric encapsulating layer 16'.

As shown in FIG. 1D', a second wiring layer 14' is formed on the top side of the dielectric encapsulating layer 16', and the second wiring layer 14' has conductors 15 formed in the dielectric encapsulating layer 16' and electrically connected with the passive component 18'. After that, the carrier board 10 is removed to expose the first wiring layer 11'.

However, according to the conventional method of fabricating the package structure 1', since the copper coil substrate is used to serve as the carrier board 10, delaminating may easily occur resulting in structural damages. Also, a laser process is employed to make blind holes (i.e., at the corresponding positions of the conductors 15), such that only circular shaped openings could be made and the shapes of the openings are undesirable.

Further, as non-conductive material and dispensing method are used to attach the passive component 18', and the diameter of the dispensed particle is more than 200 μm, the dispensed adhesive in each dispensing process varies greatly in size of the diameter and is difficult to be controlled, causing the adhesive 180' to easily spread to other regions, thus contaminating the wirings of the first wiring layer 11' thereby resulting in poor reliability.

Moreover, it is required to fabricate the dielectric material twice, followed by a laminating process to form the dielectric layer 16'. As such, the first dielectric layer 13' and the second dielectric layer can easily be dislocated, thereby increasing the fabricating time and cost. Moreover, after placing the passive component 18' and before curing the dielectric encapsulating layer 16', the passive component 18' is not fixed yet, and can easily dislocate, resulting in a poor yield.

In addition, with the use of the conductors 15 to establish an electrical connection path to one side of the passive component 18', the electrical path is increased as well as the risk of signal loss is raised, and thus the cost of using unconventional MLCC as the passive component 18' is significantly high.

Accordingly, there is an urgent need for solving the foregoing problems of the conventional arts.

SUMMARY OF THE INVENTION

In view of the foregoing drawbacks, the present invention provides a package structure, comprising: a first insulating layer having opposing first and second surfaces; a first wiring layer formed on the first surface of the first insulating layer; a plurality of first conductors formed on the first insulating layer and electrically connected with the first wiring layer; a second wiring layer formed on the second surface of the first insulating layer and electrically connected with the first wiring layer through the first conductors; a plurality of second conductors formed on the second wiring layer; a second insulating layer formed on the second surface of the first insulating layer and encapsulating the second wiring layer and the two conductors, wherein the second insulating layer has at least one opening thereon and the at least one opening extends into the second surface of the first insulating layer, which allows a portion of a surface of the first wiring layer to be exposed from the opening; and at least one electronic component disposed in the opening and electrically connected with the first wiring layer.

The present invention further provides a method of fabricating a package structure, comprising: forming a first wiring layer on a carrier board; forming a plurality of first conductors on the first wiring layer; forming a first insulating layer having opposing first and second surfaces on the carrier board, such that the first insulating layer encapsulates the first wiring layer and the first conductors, wherein the first insulating layer is coupled with the carrier board through the first surface thereof; forming a second wiring layer on the second surface of the first insulating layer, such that the second wiring layer is electrically connected with the first wiring layer through the first conductors; forming a plurality of second conductors on the second wiring layer; forming a second insulating layer on the second surface of the first insulating layer, such that the second insulating layer encapsulates the second wiring layer and the second conductors; forming at least one opening in the second insulating layer in a manner that the at least one opening extends into the second surface of the first insulating layer, such that a portion of a surface of the first wiring layer is exposed from the opening; and disposing at least one electronic component in the opening, wherein the electronic component is electrically connected with the first wiring layer.

In summary, according to the package structure of the present invention and the method of fabricating the same, two wiring layers are arranged in advance, then an opening is formed on the second insulating layer, so as to effectively utilize invalid regions outside the first conductors or second conductors to form the opening in 3D space, thereby reducing the overall size after packaging and increasing the routable region of the second wiring layer, as well as improving the electrical performance and signal stability.

Moreover, since the present invention does not utilize a core board, the overall size of the package substrate can be further reduced, thereby increasing routability.

In addition, according to the present invention, no stacking or laminating process is required to be performed on the substrate that already has an opening, and the electronic component is free of displacement due to any compression, as such, it is easier to align and fix the electronic component in position, thereby reducing yield loss.

BRIEF DESCRIPTION OF THE DRAWINGS

FIGS. 1A'-1D' are cross-sectional schematic views showing another method of fabricating a package structure according to the conventional art.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

It should be advised that the structure, ratio, and size as illustrated in this context are only used for disclosures of this specification, provided for persons skilled in the art to understand and read, and technically do not have substantial meaning. Any modification of the structure, change of the ratio relation, or adjustment of the size should be involved in the scope of disclosures in this specification without influencing the producible efficacy and the achievable objective of this specification. Further, terms such as "top", "bottom", "first", "second" and "one" are merely for illustrative purpose and should not be construed to limit the scope of the present invention. Those changes or adjustments of relative relationship without substantial change of technical content should also be considered within the category of implementation.

FIGS. 2A-2H are cross-sectional schematic views showing a method of fabricating a package structure according to the present invention.

Figure 2A:
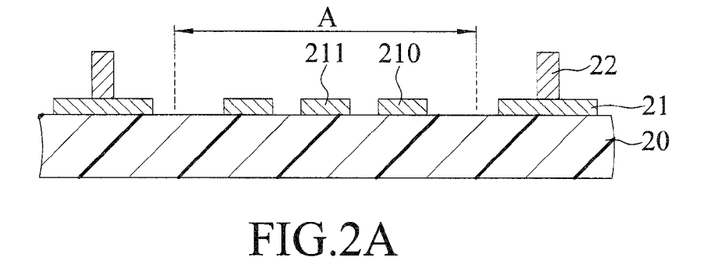
FIGS. 2A-2H are cross-sectional schematic views showing a method of fabricating a package structure according to the present invention, wherein FIGS. 2D' and 2D" are further embodiments of FIG. 2D while FIG. 2F' is another embodiment of FIG. 2F.

As shown in FIG. 2A, a first wiring layer 21 is formed on a carrier board 20, then a plurality of first conductors 22 are formed on the first wiring layer 21.

In an embodiment, at least one pre-opening region A is defined on a surface of the carrier board 20, and the carrier board 20 is a substrate such as but not specifically limited to copper substrate or other types of boards.

Further, the first wiring layer 21 comprises a plurality of electrical connection pads 210 and a plurality of conductive traces 211 electrically connected with the electrical connection pads 210. The first conductors 22 are conductive pillars such as copper pillars.

In addition, the first conductors 22 are disposed on a portion of the electrical connection pads 210 (i.e. the electrical connection pads 210 outside the pre-opening region A), such that there is no first conductors 22 being formed at where corresponding to the pre-opening region A.

Figure 2B:
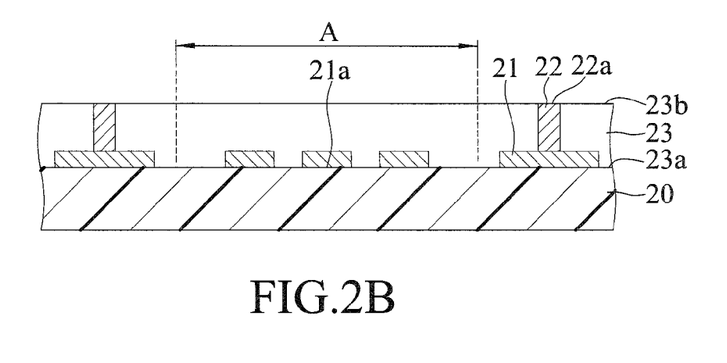

As shown in FIG. 2B, a first insulating layer 23 having a first surface 23a and an opposing second surface 23b is formed on the carrier board 20, which allows the first insulating layer 23 to encapsulate the first wiring layer 21 and the first conductors 22, and the first insulating layer 23 is coupled with the carrier board 20 through the first surface 23a thereof.

In an embodiment, a bottom surface 21a of the first wiring layer 21 is flush with the first surface 23a of the first insulating layer 23, and an end surface 22a of the first conductors 22 is exposed from the second surface 23b of the first insulating layer 23. Moreover, the first insulating layer 23 is fabricated by a laminating or molding method.

Figure 2C:
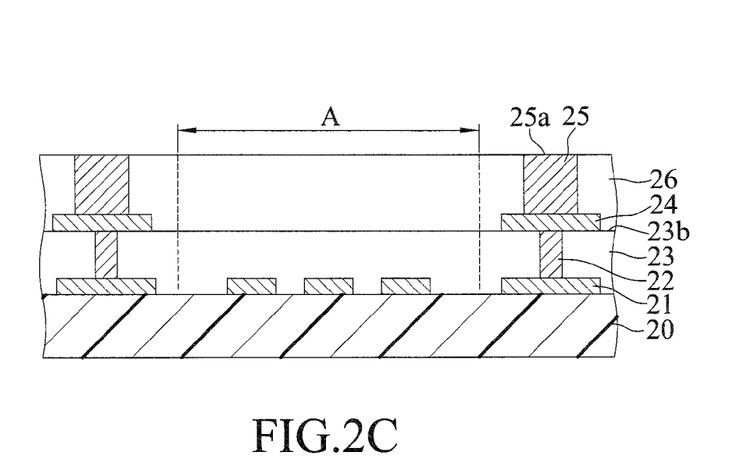

As shown in FIG. 2C, a second wiring layer 24 is formed on the second surface 23b of the first insulating layer 23, such that the second wiring layer 24 is electrically connected with the first wiring layer 21 through the first conductors 22. Subsequently, a plurality of second conductors 25 are formed on the second wiring layer 24, then a second insulating layer 26 is formed on the second surface 23b of the first insulating layer 23 for encapsulating the second wiring layer 24 and the second conductors 25.

In an embodiment, the second wiring layer 24 is directly connected with the first conductors 22. The second conductors 25 are conductive pillars such as copper pillars. An end surface 25a of the second conductors 25 is exposed from the second insulating layer 26. Further, the second insulating layer 26 is formed by a laminating or molding method.

In addition, the second wiring layer 24 and second conductors 25 are not formed on the second surface 23b of the first insulating layer 23 at where corresponding to the pre-opening region A.

Figure 2D:
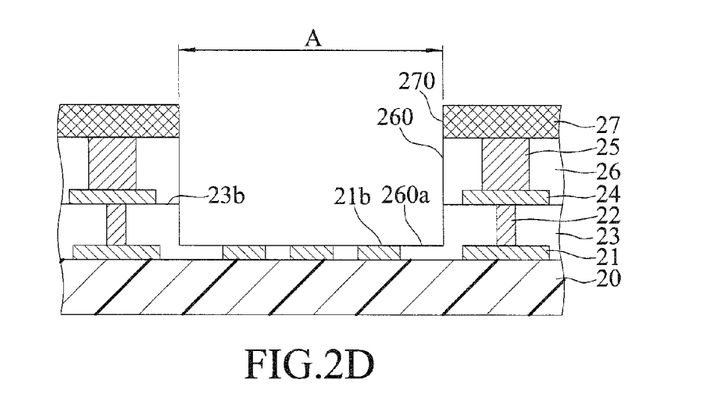

As shown in FIG. 2D, a resist layer 27 such as photo resist is formed on the second insulating layer 26. The resist layer 27 has an opening region 270 corresponding to the pre-opening region A, which allows a portion of surface of the second insulating layer 26 to be exposed from the opening region 270.

Subsequently, an opening 260 is formed on the second insulating layer 26 in the opening region 270 (i.e. position corresponding to the pre-opening region A). The opening 260 extends inside the first insulating layer 23 (i.e. downwardly removing the first insulating layer 23, which begins from the second surface 23b), allowing a portion of the surface of the first wiring layer 21 (i.e. a top surface 21b) being exposed from the opening 260.

In an embodiment, the opening 260 is formed by a polishing method such as pumice or by a laser burning method, instead of using a traditional cutting method, such that lead angles at corners of the opening 260 (such as corners at the bottom part and the opening part) can be reduced.

Further, the top surface 21b of the first wiring layer 21 is flush with a bottom surface 260a of the opening 260. In an embodiment, the top surface 21b of the first wiring layer 21 is higher than a bottom surface 260a of the opening 260, as shown in FIG. 2D'.

In an embodiment, as shown in FIG. 2D", when the top surface 21b of the first wiring layer 21 is lower than the bottom surface 260a" of the opening 260, a plurality of through holes 261 can be formed on the bottom surface 260a" of the opening 260, which allows the electrical connection pads 210 at the pre-opening region A being correspondingly exposed from the respective through holes 261.

In addition, the first wiring layer 21 is not damaged by laser, cutting, or drilling to collapse, thereby keeping the surface of the first wiring layer 21 intact.

Figure 2E:
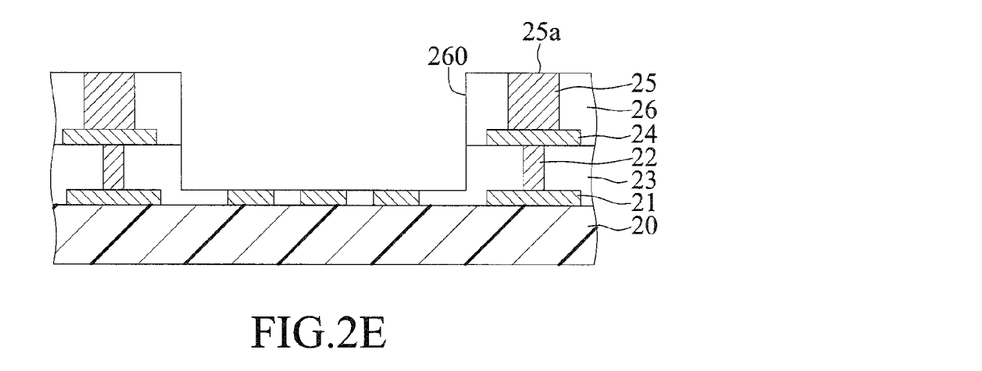

As shown in FIG. 2E, following the process of FIG. 2D, the resist layer 27 is removed. In an embodiment, the end surface 25a of the second conductors 25 is exposed from the second insulating layer 26, such that it is not necessary to fabricate contact pads on the second conductors 25, and thereby the space between each of the second conductors 25 could be effectively utilized to form the opening 260.

Figure 2F:
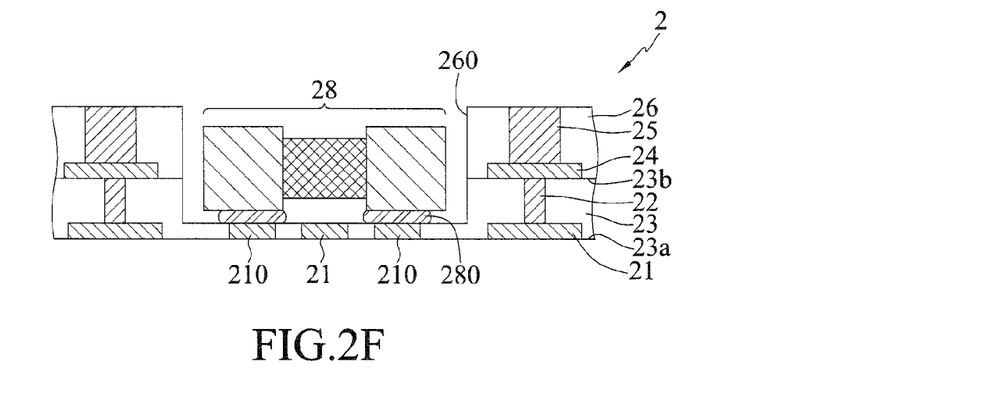

As shown in FIG. 2F, the carrier board 20 is removed, and at least one electronic component 28 is disposed in the opening 260, such that the electronic component 28 would not be encapsulated in the first insulating layer 23 or the second insulating layer 26, and the electronic component 28 is electrically connected with the electrical connection pads 210 of the first wiring layer 21.

Typical cutting method is not employed in the method according to the present invention, and thus the distance between the electronic component 28 and walls of the opening 260 can be shortened.

In an embodiment, the electronic component 28 is an active component, a passive component, or a combination thereof. The active component is a semiconductor element (such as a chip), and the passive component is a resistor, a capacitor or an inductor. The electronic component 28 as shown in FIG. 2F is a passive component such as a multi-layered ceramic capacitor (MLCC), and the electronic component 28 is fabricated by a standard tin-soldering procedure without the need of using costly copper electrodes. As such, the fabrication cost is reduced.

Moreover, the electronic component 28 is fixed on and electrically connected to the electrical connection pads 210 with the use of printing or dispensing a conductive material 280 (such as solder materials and conductive adhesives). Also, through limiting the size or shape of each of the electrical connection pads 210, the adhesive can be prevented from spreading to the electrical connection pads 210 at the vicinity.

Further in an embodiment, as shown in FIG. 2F', the electronic component 28' is an active component.

Figure 2G:
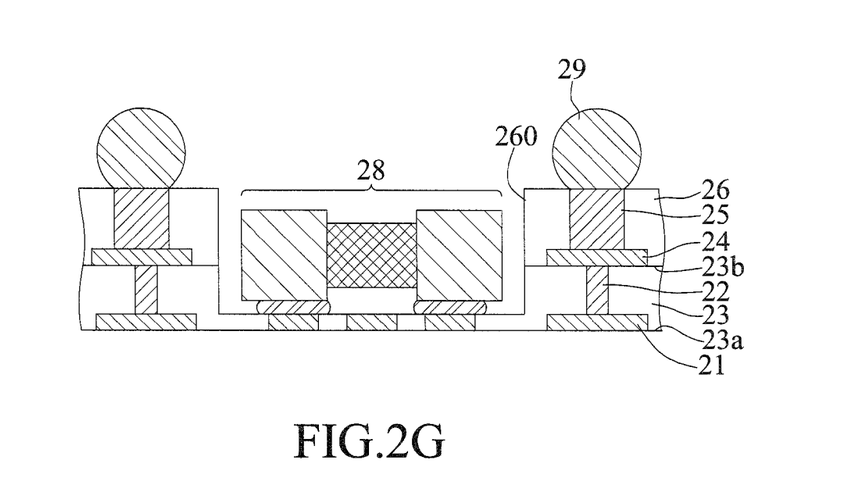

As shown in FIG. 2G, a plurality of conductive elements 29 such as solder balls are formed on the second insulating layer 26, and the conductive elements 29 are electrically connected with the second conductors 25, for stacking and coupling other electronic devices (not shown) through the conductive elements 29.

In an embodiment, with the design of the conductive elements 29 that facilitates the usable space being expanded, the electronic component 28 will not make contact with other electronic devices in subsequent procedures.

Figure 2H:
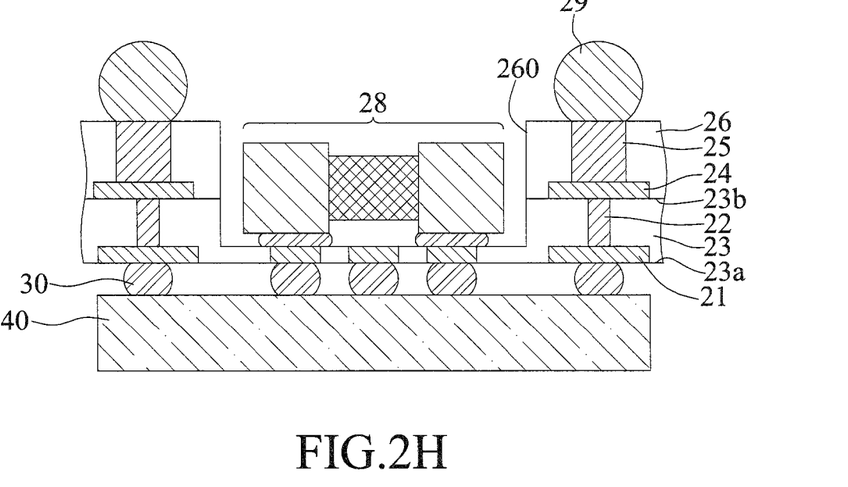

As shown in FIG. 2H, a second electronic component 40 is disposed on the first surface 23a of the first insulating layer 23 through a plurality of conductive elements 30 such as solder balls, such that the second electronic component 40 is electrically connected with the first wiring layer 21.

In an embodiment, the second electronic component 40 is an active component, a passive component, or a combination thereof. The active component is a semiconductor element (such as a chip), and the passive component is a resistor, a capacitor or an inductor. In an embodiment, the second electronic component 40 shown in FIG. 2H is an active component.

According to the method of fabricating the package structure 2 of the present invention, the opening 260 is formed in an invalid region between each of the first conductors 22 (or between each of the second conductors 25), i.e. above the pre-opening region A, which enables to effectively use 3D space, thereby reducing the overall size (such as thickness) of after packaging and increasing routability of the second wiring layer 24, as well as increasing electrical performance and signal stability.

Comparing with the conventional embedded element structure that uses glass fibers as a dielectric material, the present invention does not use a core board, thereby further reducing the overall size of the substrate and enhancing routability in limited space.

The present invention does not require stacking or laminating an opened substrate, and thus the electronic component 28 is free of displacement due to compression, such that the electronic component 28 can be accurately positioned to reduce yield loss.

In addition, a traditional printed circuit board and a ball grid array (BGA) package and so on all require laminating multiple dielectric layers to complete the process of manufacturing embedded element. As such, mismatch often occurs between the height of the embedded element and the thickness of the dielectric layer. Further, if a method of forming a cavity is utilized to embed electronic component, the opening process is often carried out with a mechanical molding machine and cutting tool. In other words, it is required to form opening in every dielectric layer for each recess, which is time consuming and expensive. According to the method of embedding element of the present invention, it only requires a typical surface mount technology (SMT) packaging process followed by a molding process, which eliminates the need of using multiple dielectric layers to perform multiple openings processes. Further, owing to the properties of the materials used in the present invention, a outer opening process (such as for the opening 260) can be carried out in a single batch or a large scale by a method such as pumice, thereby reducing the production time and cost, which could not be achieved by the method of fabrication circuit board or BGA package according to the conventional art.

The present invention further provides a package structure 2, comprising: a first insulating layer 23, a first wiring layer 21, a plurality of first conductors 22, a second wiring layer 24, a plurality of second conductors 25, a second insulating layer 26, and at least one electronic component 28, 28'.

The first insulating layer 23 has a first surface 23a and an opposing second surface 23b.

The first wiring layer 21 is coupled to the first surface 23a of the first insulating layer 23. For instance, the first wiring layer 21 is embedded in the first insulating layer 23 from the first surface 23a of the first insulating layer 23, and a bottom surface 21a of the first wiring layer 21 opposing to a top surface 21b exposed from the opening 260 is flush with the first surface 23a of the first insulating layer 23.

The first conductors 22 are conductive pillars, which are disposed in the first insulating layer 23, coupled to the second surface 23b of the first insulating layer 23, and electrically connected with the first wiring layer 21.

The second wiring layer 24 is disposed on the second surface 23b of the first insulating layer 23, and is electrically connected with the first wiring layer 21 by the first conductors 22.

The second conductors 25 are conductive pillars, which are disposed on the second wiring layer 24.

The second insulating layer 26 is disposed on the second surface 23b of the first insulating layer 23 and encapsulates the second wiring layer 24 and the second conductors 25, the second insulating layer 26 has at least one opening 260 thereon extending into the first insulating layer 23, which allows a portion of surface of the first wiring layer 21 (top surface 21b) to be exposed from the opening 260.

The electronic component 28, 28' is disposed in the opening 260 and electrically connected with the first wiring layer 21. For instance, the electronic component 28, 28' is an active component, passive component or a combination thereof.

In an embodiment, the top surface 21b of the first wiring layer 21 is higher than or flush with a bottom surface 260a, 260a' of the opening.

In an embodiment, the top surface 21b of the first wiring layer 21 is lower than the bottom surface 260a" of the opening 260.

In an embodiment, the first wiring layer 21 comprises a plurality of electrical connection pads 210 and a plurality of conductive traces 211 electrically connected with the electrical connection pads 210. The electrical connection pads 210 are coupled and electrically connected with the electronic component 28. The first conductors 22 are formed on a portion of the electrical connection pads 210.

In an embodiment, the package structure 2 further comprises a plurality of conductive elements 29 disposed on the second insulating layer 26 and electrically connected with each of the second conductors 25.

In an embodiment, the package structure 2 further comprises a second electronic component 40 disposed on the first surface 23a of the first insulating layer 23, and the second electronic component 40 is electrically connected with the first wiring layer 21.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A package structure, comprising:
    a first insulating layer having opposing first and second surfaces;
    a first wiring layer formed on the first surface of the first insulating layer;
    a plurality of first conductors formed in the first insulating layer and electrically connected with the first wiring layer;
    a second wiring layer formed on the second surface of the first insulating layer and electrically connected with the first wiring layer through the first conductors;
    a plurality of second conductors formed on the second wiring layer;
    a second insulating layer formed on the second surface of the first insulating layer and encapsulating the second wiring layer and the second conductors, wherein the second insulating layer has at least one opening extending into the first insulating layer, which allows a portion of a surface of the first wiring layer to be exposed from a bottom surface of the opening; and
    at least one electronic component disposed in on the bottom surface of the opening, bonded on the portion of the surface of the first wiring layer exposed from the bottom surface of the opening, and electrically connected with the first wiring layer.

2. The package structure of claim 1, wherein the first wiring layer is embedded in the first insulating layer from the first surface thereof.

3. The package structure of claim 1, wherein the first conductors or second conductors are conductive pillars.

4. The package structure of claim 1, wherein the exposed surface of the first wiring layer is higher than or flush with the a bottom surface of the opening.

5. The package structure of claim 1, wherein the exposed surface of the first wiring layer is lower than the a bottom surface of the opening.

6. The package structure of claim 1, wherein the electronic component is an active component, a passive component or a combination thereof.

7. The package structure of claim 1, further comprising a plurality of conductive elements formed on the second insulating layers, the conductive elements being electrically connected with the second conductors, respectively.

8. The package structure of claim 1, further comprising a second electronic component disposed on the first surface of the first insulating layer and electrically connected with the first wiring layer.

9. A method of fabricating a package structure, comprising:
    forming a first wiring layer on a carrier board;
    forming a plurality of first conductors on the first wiring layer;
    forming a first insulating layer having opposing first and second surfaces on the carrier board, such that the first insulating layer encapsulates the first wiring layer and the first conductors, wherein the first insulating layer is coupled with the carrier board through the first surface thereof;
    forming a second wiring layer on the second surface of the first insulating layer, such that the second wiring layer is electrically connected with the first wiring layer through the first conductors;
    forming a plurality of second conductors on the second wiring layer;
    forming a second insulating layer on the second surface of the first insulating layer, such that the second insulating layer encapsulates the second wiring layer and the second conductors;
    forming at least one opening in the second insulating layer in a manner that the opening extends into the first insulating layer, such that a portion of a surface of the first wiring layer is exposed from a bottom surface of the opening; and
    disposing at least one electronic component on the bottom surface of in the opening, wherein the electronic component is bonded on the portion of the surface of the first wiring layer exposed from the bottom surface of the opening, and electrically connected with the first wiring layer.

10. The method of claim 9, wherein another surface of the first wiring layer opposing the surface being exposed from the opening is flush with the first surface of the first insulating layer.

11. The method of claim 9, wherein the first conductors or the second conductors are conductive pillars.

12. The method of claim 9, wherein the surface of the first wiring layer being exposed from the opening is higher or flush with the a bottom surface of the opening.

13. The method of claim 9, wherein the surface of the first wiring layer being exposed from the opening is lower than the a bottom surface of the opening.

14. The method of claim 9, wherein the opening is formed by a polishing or laser method.

15. The method of claim 9, wherein the electronic component is an active component, a passive component or a combination thereof.

16. The method of claim 9, further comprising forming a plurality of conductive elements on the second insulating layer, wherein the conductive elements are electrically connected with the second conductors.

17. The method of claim 9, further comprising removing the carrier board after the opening is formed.

18. The method of claim 17, further comprising disposing a second electronic component on the first surface of the first insulating layer after the carrier board is removed, wherein the second electronic component is electrically connected with the first wiring layer.

* * * * *